(12) United States Patent
Jang et al.

(10) Patent No.: US 12,207,516 B2
(45) Date of Patent: Jan. 21, 2025

(54) ORGANIC LIGHT-EMITTING DISPLAY DEVICE

(71) Applicant: Samsung Display Co., LTD., Yongin-si (KR)

(72) Inventors: Sang Eok Jang, Seoul (KR); Seung Chan Lee, Hwaseong-si (KR); Sun Ho Kim, Seongnam-si (KR); Dong Hwan Shim, Hwaseong-si (KR); Sun Hee Lee, Hwaseong-si (KR); Gun Hee Kim, Seoul (KR); Tae Hoon Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 186 days.

(21) Appl. No.: 17/162,106

(22) Filed: Jan. 29, 2021

(65) Prior Publication Data
US 2021/0257419 A1   Aug. 19, 2021

(30) Foreign Application Priority Data

Feb. 14, 2020   (KR) .................. 10-2020-0018185

(51) Int. Cl.
*H10K 59/35* (2023.01)
*H10K 50/15* (2023.01)
(Continued)

(52) U.S. Cl.
CPC .......... *H10K 59/353* (2023.02); *H10K 50/15* (2023.02); *H10K 50/16* (2023.02); *H10K 50/171* (2023.02); *H10K 59/131* (2023.02); *H10K 59/65* (2023.02)

(58) Field of Classification Search
CPC ............... H01L 27/326; H01L 27/3234; H01L 27/3276; H01L 27/3218; H01L 51/5056;
(Continued)

(56) References Cited

U.S. PATENT DOCUMENTS 7,956,987 B2   6/2011   Ohsaki
8,350,257 B2   1/2013   Pieh et al.
(Continued)

FOREIGN PATENT DOCUMENTS

KR   10-2008-0114581   12/2008
KR      10-1351410    1/2014
(Continued)

*Primary Examiner* — Vongsavanh Sengdara
(74) *Attorney, Agent, or Firm* — Lewis Roca Rothgerber Christie LLP

(57) ABSTRACT

An organic light-emitting display device includes: a display panel having a first display area and a second display area, the first and second display areas having different light transmittances from each other in a unit area, wherein the display panel includes a plurality of organic light-emitting diodes disposed in the first display area and the second display area, wherein a first organic light-emitting diode disposed in the first display area and a second organic light-emitting diode disposed in the second display area each include at least one light emitter, and the number of the light emitter included in the second organic light-emitting diode is greater than the number of the light emitter included in the first organic light-emitting diode.

12 Claims, 11 Drawing Sheets

(51) Int. Cl.
*H10K 50/16* (2023.01)
*H10K 50/17* (2023.01)
*H10K 59/131* (2023.01)
*H10K 59/65* (2023.01)

(58) Field of Classification Search
CPC ............ H01L 51/5072; H01L 51/5092; H10K 59/353; H10K 59/65; H10K 59/171; H10K 59/121; H10K 50/15; H10K 50/16; H10K 50/171

See application file for complete search history.

(56) References Cited

U.S. PATENT DOCUMENTS

| | | | |
|---|---|---|---|
| 8,796,676 | B2 | 8/2014 | Pieh et al. |
| 10,042,028 | B2 | 8/2018 | Jo et al. |
| 2010/0141126 | A1* | 6/2010 | Otsu ............... H10K 85/342 313/504 |
| 2013/0135328 | A1 | 5/2013 | Rappoport et al. |
| 2014/0198468 | A1 | 7/2014 | Kim et al. |
| 2015/0102304 | A1* | 4/2015 | Go ................ H10K 59/8722 438/33 |
| 2018/0089485 | A1* | 3/2018 | Bok ................... G06F 3/0412 |
| 2018/0190193 | A1* | 7/2018 | Kim .................. G09G 3/3233 |
| 2018/0351109 | A1* | 12/2018 | Tada .................... C09K 11/06 |
| 2018/0366586 | A1 | 12/2018 | Son et al. |
| 2019/0013368 | A1 | 1/2019 | Chung et al. |
| 2020/0211480 | A1* | 7/2020 | Xiang ................ G09G 3/3406 |
| 2021/0391547 | A1* | 12/2021 | Geum ............... H10K 85/6572 |
| 2021/0408144 | A1* | 12/2021 | Li ....................... H10K 59/65 |

FOREIGN PATENT DOCUMENTS

| | | |
|---|---|---|
| KR | 10-2014-0092119 | 7/2014 |
| KR | 10-1429924 | 8/2014 |
| KR | 10-2016-0051355 | 5/2016 |
| KR | 10-2017-0002719 | 1/2017 |

* cited by examiner

OLED2:EL1,OL2,and EL2

ORGANIC LIGHT-EMITTING DISPLAY DEVICE

CROSS REFERENCE TO RELATED APPLICATION

This application claims priority from and the benefit of Korean Patent Application No. 10-2020-0018185 filed on Feb. 14, 2020, which is hereby incorporated by reference for all purposes as if fully set forth herein.

BACKGROUND

Field

Exemplary implementations of the invention relate generally to a display device and more specifically, to a display device having an organic light-emitting diode.

Discussion of the Background

A display device converts an electric signal to display an image thereby providing a user with a visual information. The display device may include a light-transmitting area which is transmits an external light incident thereon. A functional module such as a camera module, a sensor module or the like, which is disposed in the rear of a display device, may perceive or detect an object, a person or the like, which is disposed in front of the display device. The portion of the display area that receives such a module ("partial display area") must have a light-transmitting area for the module to function.

The above information disclosed in this Background section is only for understanding of the background of the inventive concepts, and, therefore, it may contain information that does not constitute prior art.

SUMMARY

Applicant discovered that the partial display area in a display device has a lowered brightness due to the light-transmitting area in the partial display area. Further, if the driving current for pixels in the partial display area is increased to compensate for the lowered brightness in the partial display area, the life-span, durability, and reliability of the display device are reduced.

Display devices constructed according to the principles and exemplary implementations of the invention are capable of compensating for a lowered brightness of a partial display area in the display devices due to a light-transmitting area in the partial display area without decreasing the life-span, the durability, and the reliability of the display devices. For example, according to some exemplary implementations the display device may include an organic light-emitting diode having tandem structures in the partial display area.

Organic light-emitting display device constructed according to the principles and some exemplary implementations of the invention having a substantially enlarged display area and an improved design.

Additional features of the inventive concepts will be set forth in the description which follows, and in part will be apparent from the description, or may be learned by practice of the inventive concepts.

According to an aspect of the invention, an organic light-emitting display device includes: a display panel having a first display area and a second display area, the first and second display areas having different light transmittances from each other in a unit area, wherein the display panel includes a plurality of organic light-emitting diodes disposed in the first display area and the second display area, wherein a first organic light-emitting diode disposed in the first display area and a second organic light-emitting diode disposed in the second display area each include at least one light emitter, and the number of the light emitter included in the second organic light-emitting diode is greater than the number of the light emitter included in the first organic light-emitting diode.

The at least one light emitter may include a light-emitting structure unit having at least an emission layer and at least one of a hole-transporting layer, a hole-injection layer, an electron-transporting layer and an electron-injection layer.

The first organic light-emitting diode may have a single light-emitting structure, and the second organic light-emitting diode may have a multiple light-emitting structure.

The first organic light-emitting diode may include two light-emitting structure units, and the second organic light-emitting diode may include at least three light-emitting structure units.

The second display area may include a first color subpixel area and a second color subpixel area, and wherein: the first color subpixel area may include a first sub-diode of the second organic light-emitting diode, the second color subpixel area may include a second sub-diode of the second organic light-emitting diode, and the number of a light emitter of the second sub-diode in the second color subpixel area may be smaller than the number of a light emitter of the first sub-diode in the first color subpixel area.

The display panel may include: a first driving element configured to supply a first driving voltage to the first organic light-emitting diode; a second driving element configured to supply a second driving voltage to the second organic light-emitting diode; and power wirings configured to transfer a power voltage to the first and second driving elements, wherein: a first power wiring electrically connected to the first driving element may be configured to receive a first substantially constant voltage, and a second power wiring electrically connected to the second driving element may be configured to receive a second substantially constant voltage different from the first substantially constant voltage.

The second display area may include a pixel area and a light-transmitting area, which are alternately arranged, wherein the second organic light-emitting diode may be disposed in the pixel area of the second display area.

The organic light-emitting display device may further include a functional module overlapping the second display area.

The functional module may include at least one of a camera module and a sensor module.

The display panel may further include a third display area having a light transmittance in a unit area greater than those of the first display area and the second display area.

The functional module may include a sensor module overlapping the second display area and a camera module overlapping the third display area.

The second organic light-emitting diode may be configured to generate a light having a greater brightness than the first organic light-emitting diode.

According to another aspect of the invention, an organic light-emitting display device includes: a display panel including a first display area and a second display area, the first and second display areas having different light transmittances from each other in a unit area, wherein the display panel includes a plurality of organic light-emitting diodes disposed in the first display area and the second display area, and wherein an emission layer of a second organic light-emitting diode disposed in the second display area includes a different material from an emission layer of a first organic light-emitting diode disposed in the first display area.

The emission layer of the first organic light-emitting diode may include a fluorescence dopant, and the emission layer of the second organic light-emitting diode comprises a thermally activated delayed fluorescence dopant.

The emission layer of the first organic light-emitting diode may include a fluorescence dopant, and the emission layer of the second organic light-emitting diode comprises a phosphorescence dopant.

The emission layer of the first organic light-emitting diode may include a phosphorescence dopant, and the emission layer of the second organic light-emitting diode comprises a TADF dopant.

The second display area may include a pixel area and a light-transmitting area, which are alternately arranged, wherein the second organic light-emitting diode may be disposed in the pixel area of the second display area.

The organic light-emitting display device may further include a functional module overlapping the second display area, the functional module including at least one of a camera module and a sensor module.

The display panel may further include a third display area having a light transmittance in a unit area greater than those of the first display area and the second display area.

The organic light-emitting display device may further include a sensor module overlapping the second display area and a camera module overlapping the third display area.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
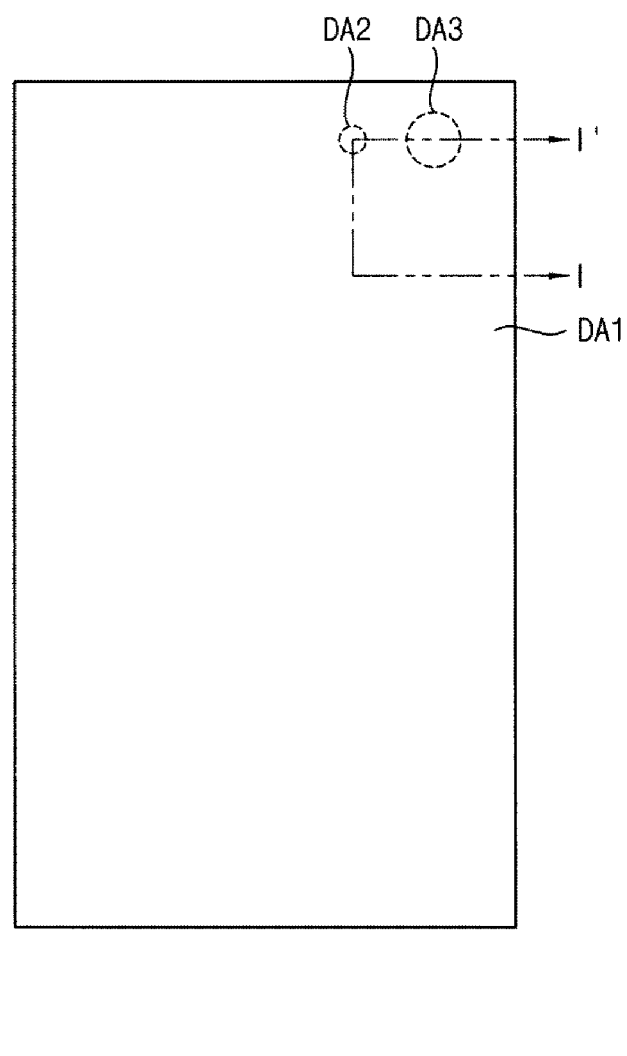
FIG. 1 is a plan view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
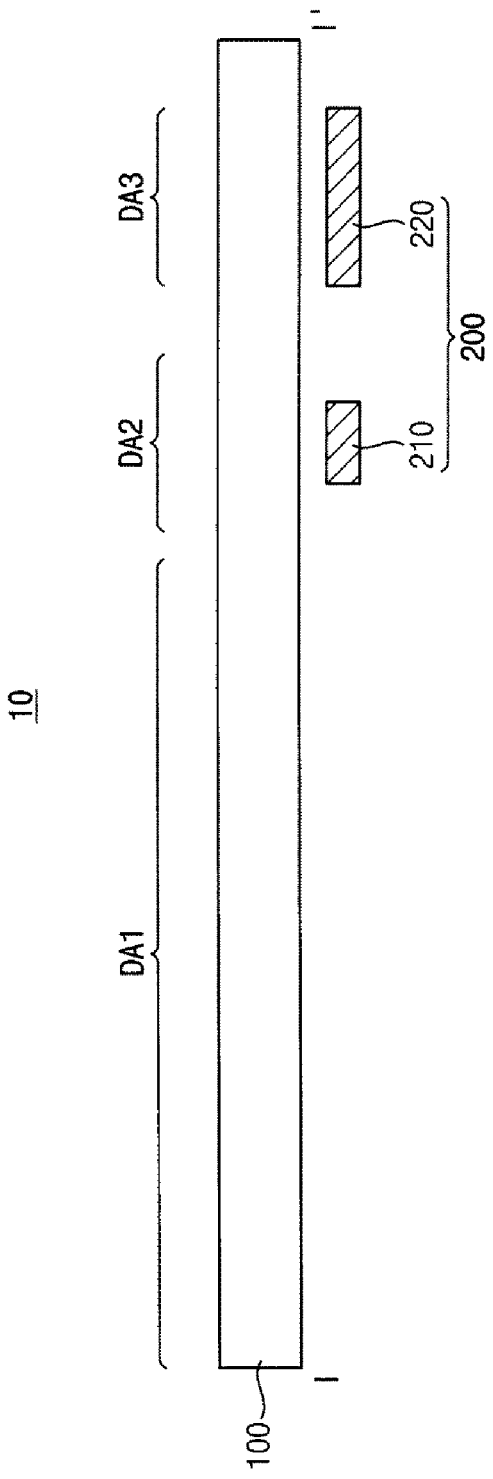
FIG. 2 is a cross-sectional view taken along the line I-I' of FIG. 1.

FIG. 1 is a plan view of an exemplary embodiment of a display device constructed according to the principles of the invention. FIG. 2 is a cross-sectional view taken along the line I-I' of FIG. 1.

Referring to FIGS. 1 and 2, a display device 10 includes a display panel 100 and a functional module 200.

The display panel 100 may include a first display area DA1, a second display area DA2 and a third display area DA3. The first display area DA1, the second display area DA2 and the third display area DA3 may display an image, respectively. The second display area DA2 and the third display area DA3 may include a light-transmitting area that transmits an external light. Thus, the second display area DA2 and the third display area DA3 may transmit an external light incident thereon as well as display an image. The first display area DA1, the second display area DA2 and the third display area DA3 may be adjacent to each other. For example, the first display area DA1 may surround the second display area DA2 and the third display area DA3 in a plan view.

For example, a light-transmitting area may be defined by an area where pixel elements for generating light are partially removed to increase a light transmittance. In an exemplary embodiment, the light-transmitting area may be defined by an opening formed by removing a portion of a common electrode. Furthermore, at least one of a pixel electrode, a metal wiring, an organic insulation layer and an inorganic insulation layer may be removed in the light-transmitting area to further increase a light transmittance.

Referring to FIG. 2, the functional module 200 is disposed under the display panel 100. Examples of the functional module 200 may include a camera module, a face recognition sensor module, an iris recognition sensor module, an acceleration sensor module, a geomagnetism sensor module, a near sensor module, an IR sensor module, an illumination sensor module or the like. The cameral module may be used for imaging an object in front of the display panel. The face recognition sensor module may be used for recognizing a face of a user. The iris recognition sensor module may be used for recognizing an iris of a user. The acceleration sensor module and the geomagnetism sensor module may be used for determining movement of the display device. The near sensor module and IR sensor module may be used for sensing an object getting close to the display device. The illumination sensor module may be used for measuring an external brightness.

In an exemplary embodiment, the display device 10 may include a first functional module 210 overlapping at least a portion of the second display area DA2 in a vertical direction substantially perpendicular to a surface of the display panel 100 ("thickness direction") of the display device. For example, the first functional module 210 may be a sensor module. As described the above, the second display area DA2 may include a light-transmitting area. Thus, the first functional module 210 disposed on a rear surface of the display panel 100 may detect an object or a person, which is disposed in front of the display device, through the light-transmitting area of the second display area DA2.

In an exemplary embodiment, the display device 10 may include a second functional module 220 overlapping at least a portion of the third display area DA3. For example, the second functional module 220 may be a camera module. As described the above, the second display area DA2 may include a light-transmitting area. Thus, the second functional module 220 disposed on a rear surface of the display panel 100 may image an object or a person, which is disposed in front of the display device, through the light-transmitting area of the third display area DA3.

The second display area DA2 and the third display area DA3 may have various sizes, shapes, dispositions, and arrangements. For example, the second display area DA2 may have an elongated (stripe) shape extending in a direction to overlap a plurality of sensor modules. In an exemplary embodiment, the second display area DA and the third display area DA3 may be directly adjacent to each other. In an exemplary embodiment, one of the second display area DA and the third display area DA3 may surround the other.

Figure 3:
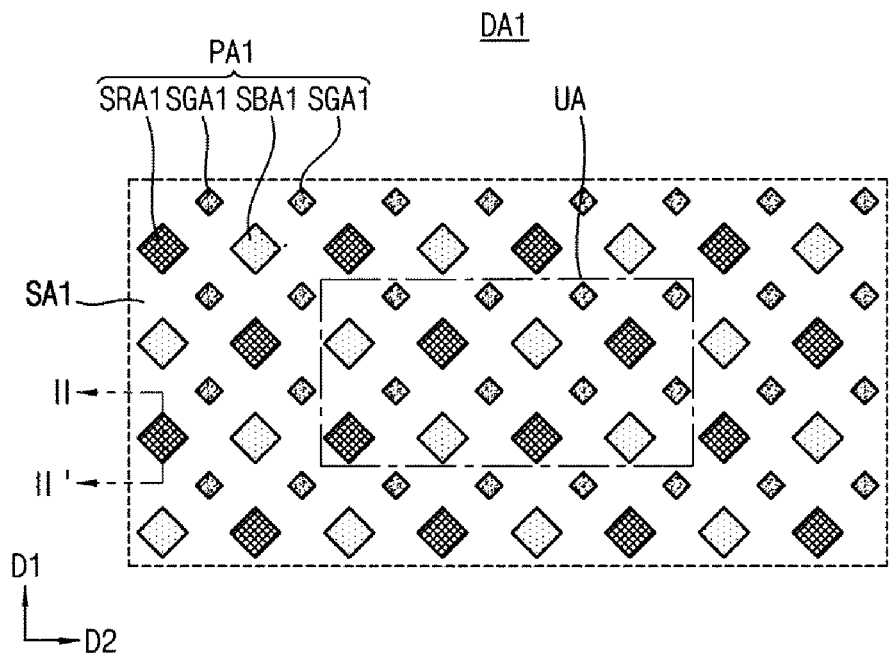
FIG. 3 is an enlarged plan view of a first display area of the display device of FIG. 1.
Figure 4:
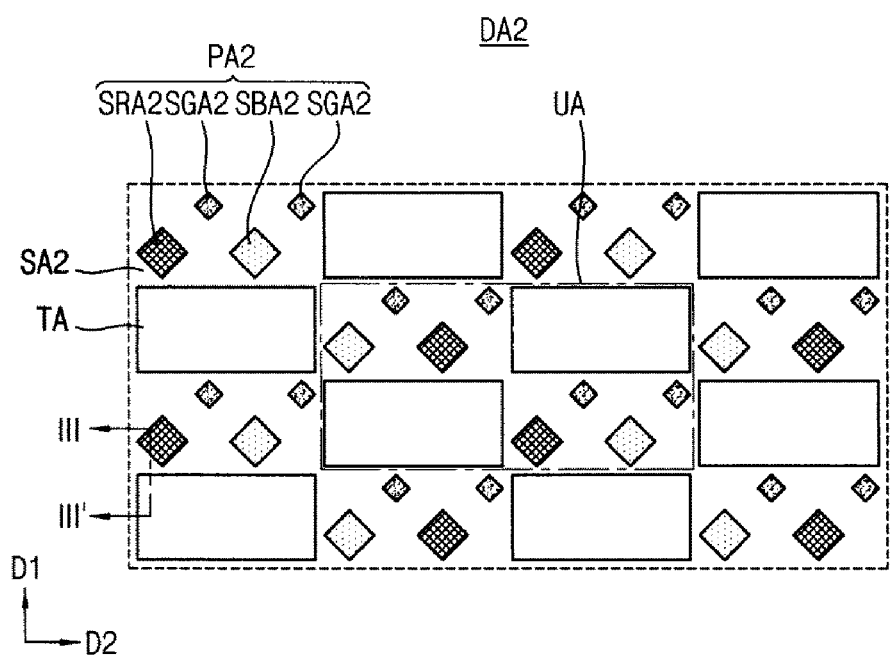
FIG. 4 is an enlarged plan view of a second display area of the display device of FIG. 1.
Figure 5:
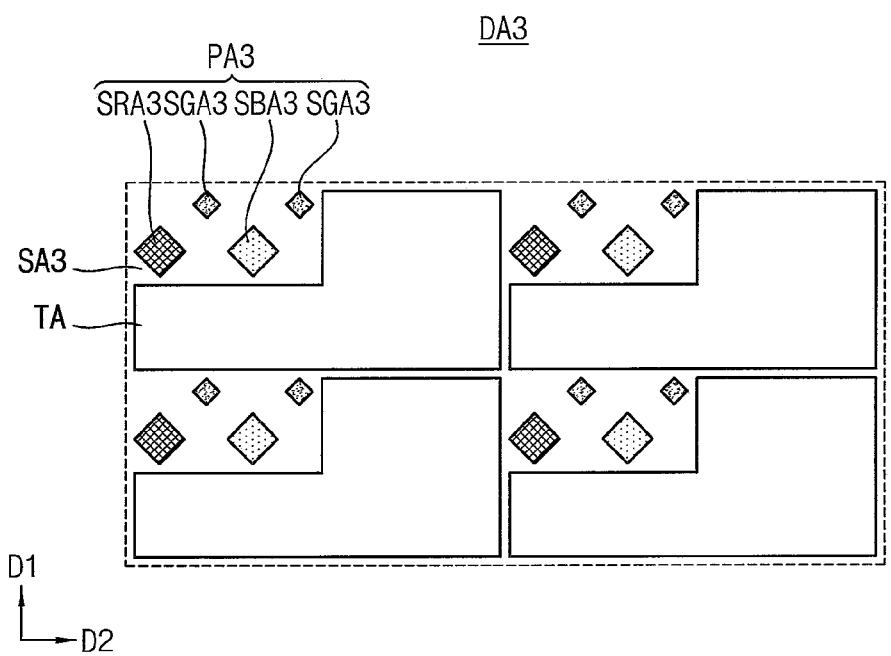
FIG. 5 is an enlarged plan view of a third display area of the display device of FIG. 1.

FIG. 3 is an enlarged plan view of a first display area of the display device of FIG. 1. FIG. 4 is an enlarged plan view of a second display area of the display device of FIG. 1. FIG. 5 is an enlarged plan view of a third display area of the display device of FIG. 1.

The first display area DA1 may include a first pixel area PA1 and a first surrounding area SA1, and the second display area DA2 may include a second pixel area PA2, a light-transmitting area TA and a second surrounding area SA2. Pixels may be disposed in the first pixel area PA1 and the second pixel area PA2, and light generated by the pixels may exit from the first pixel area PA1 and the second pixel area PA2.

The first pixel area PA1 may include a plurality of first subpixel areas SRA1, SGA1 and SBA1, which emit lights having different colors from each other. The second pixel area PA2 may include a plurality of second subpixel areas SRA2, SGA2 and SBA2, which emit lights having different colors from each other. In an exemplary embodiment, the first subpixel areas SRA1, SGA1 and SBA1 may include a first red pixel area SRA1, a first green pixel area SGA1, and a first blue pixel area SBA1. The second subpixel areas SRA2, SGA2 and SBA2 may include a second red pixel area SRA2, a second green pixel area SGA2, and a second blue pixel area SBA2. However, exemplary embodiments are not limited thereto, and the number of the subpixels disposed in the second pixel area PA2 may be varied.

The light-transmitting area TA may transmit an external light incident thereon. Since the second display area DA2 includes the light-transmitting area TA, which transmits an external light, the first functional module 210 overlapping the second display area DA2 may detect an object or a person, which is disposed in front of the display device, through the light-transmitting area TA. The first surrounding area SA1 may surround the first pixel area PA1. The second surrounding area SA2 may surround the second pixel area PA2 and the light-transmitting area TA. The first surrounding area SA1 and the second surrounding area SA2 do not emit a light. The first surrounding area SA1 and the second surrounding area SA2 may be defined an area substantially blocking an external light or an area having a light transmittance less than the minimum light transmittance required for the functional module.

Since the second display area DA2 includes the light-transmitting area TA, the number of the second subpixel areas SRA2, SGA2 and SBA2 disposed in a unit area may be smaller than the number of the first subpixel areas SRA1, SGA1 and SBA1 disposed in a unit area. Thus, the light transmittance of the second display area DA2 in a unit area may be greater than the light transmittance of the first display area DA1 in a unit area. In an exemplary embodiment, the sum of the light-transmitting area TA in the second display area DA2 may be equal to or more than ½ of the entire area of the second display area DA2. For example, the second pixel area PA2 and the light-transmitting area TA may be alternately arranged in the second display area DA2.

In an exemplary embodiment, the number of the second subpixel areas SRA2, SGA2 and SBA2 in a unit area may be ½ of the number of the first subpixel areas SRA1, SGA1 and SBA1 in a unit area. For example, as illustrated in FIGS. 3 and 4, when the number of the first subpixel areas SRA1, SGA1 and SBA1 in a unit area UA is 16, the number of the second subpixel areas SRA2, SGA2 and SBA2 disposed in a unit area UA may be 8.

In an exemplary embodiment, arrangement of the second subpixel areas SRA2, SGA2 and SBA2 may be substantially the same as that of the first subpixel areas SRA1, SGA1 and SBA1.

In an exemplary embodiment, the size of the second subpixel areas SRA2, SGA2 and SBA2 may be substantially same as the size of the first subpixel areas SRA1, SGA1 and SBA1. For example, the second red pixel area SRA2, the second green pixel area SGA2, and the second blue pixel area SBA2 may have the substantially same size as the first red pixel area SRA1, the first green pixel area SGA1, and the first blue pixel area SBA1, respectively.

However, exemplary embodiments are not limited thereto. For example, at least one of the second subpixel areas SRA2, SGA2 and SBA2 may have a size larger than a corresponding one of the first subpixel areas SRA1, SGA1 and SBA1. Furthermore, the first display area DA1 and the second display area DA2 may have different subpixel configurations. For example, the first display area DA1 may include subpixel areas having a stripe shape, and the second display area DA2 may include subpixel areas having a pentile configuration as illustrated in FIG. 4.

The third display area DA3 may overlap a camera module in the thickness direction. For example, the third display area DA3 may have a generally circular shape or a generally rectangular shape to correspond to the camera module.

The third display area DA3 may include a third pixel area PA3, a light-transmitting area TA and a third surrounding area SA3. The third pixel area PA3 may include a plurality of third subpixel areas SRA3, SGA3 and SBA3, which emit lights having different colors from each other. In an exemplary embodiment, the third subpixel areas SRA3, SGA1 and SBA1 may include a third red pixel area SRA3 configured to emit a red light, a third green pixel area SGA3 configured to emit a green light, and a third blue pixel area SBA3 configured to emit a blue light.

In an exemplary embodiment, the third display area DA3 may have a light transmittance in a unit area different than those of the first display area DA1 and the second display area DA2. The third display area DA3 may include the light-transmitting area TA having a size greater than the light-transmitting area TA of the second display area DA2 to increase a light transmittance thereof. For example, as illustrated in FIG. 5, the ratio of the light-transmitting area TA to substantially the entire area of the third display area DA3 may be about 75%. However, exemplary embodiments are not limited thereto. For example, the ratio of the light-transmitting area TA to an entire area of the third display area DA3 may be at least about 80% or about 90%.

In the description, the terms such as "first", "second", "third" or the like are not used for specifying elements. In an exemplary embodiment, the second display area DA2 may be separated from the third display area, however, exemplary embodiments are not limited thereto. For example, the second display area DA2 and the third display area may have substantially the same configuration including substantially the same subpixel arrangement and light transmittance in a unit area. A sensor module and a camera module may be disposed under the second display area DA2 and the third display area, which have substantially the same configuration.

Figure 6:
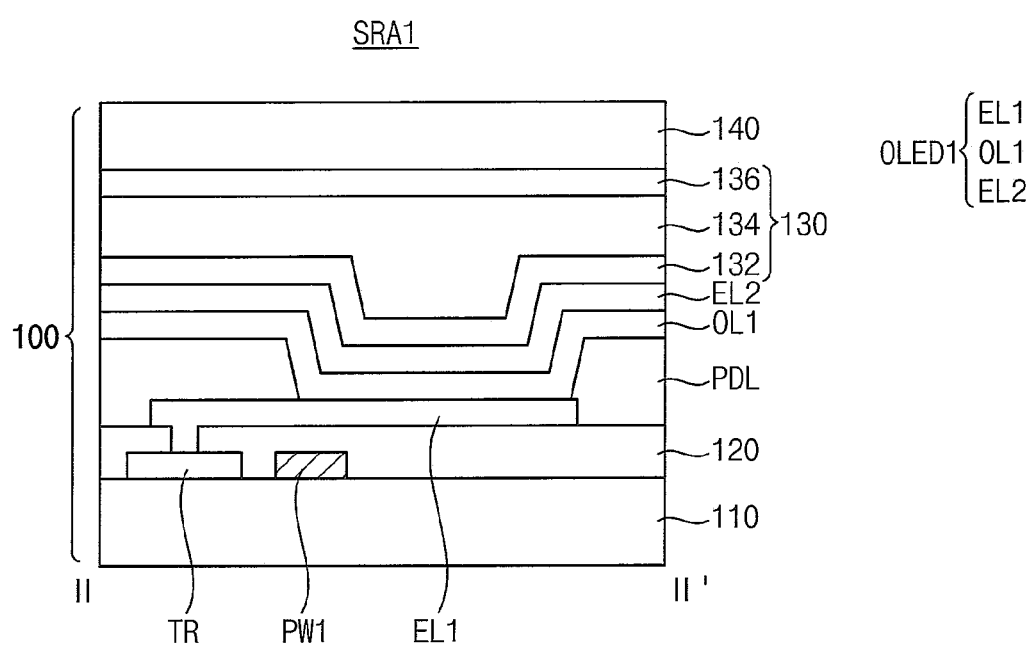
FIG. 6 is a cross-sectional view taken along the line II-II' of FIG. 3.
Figure 7:
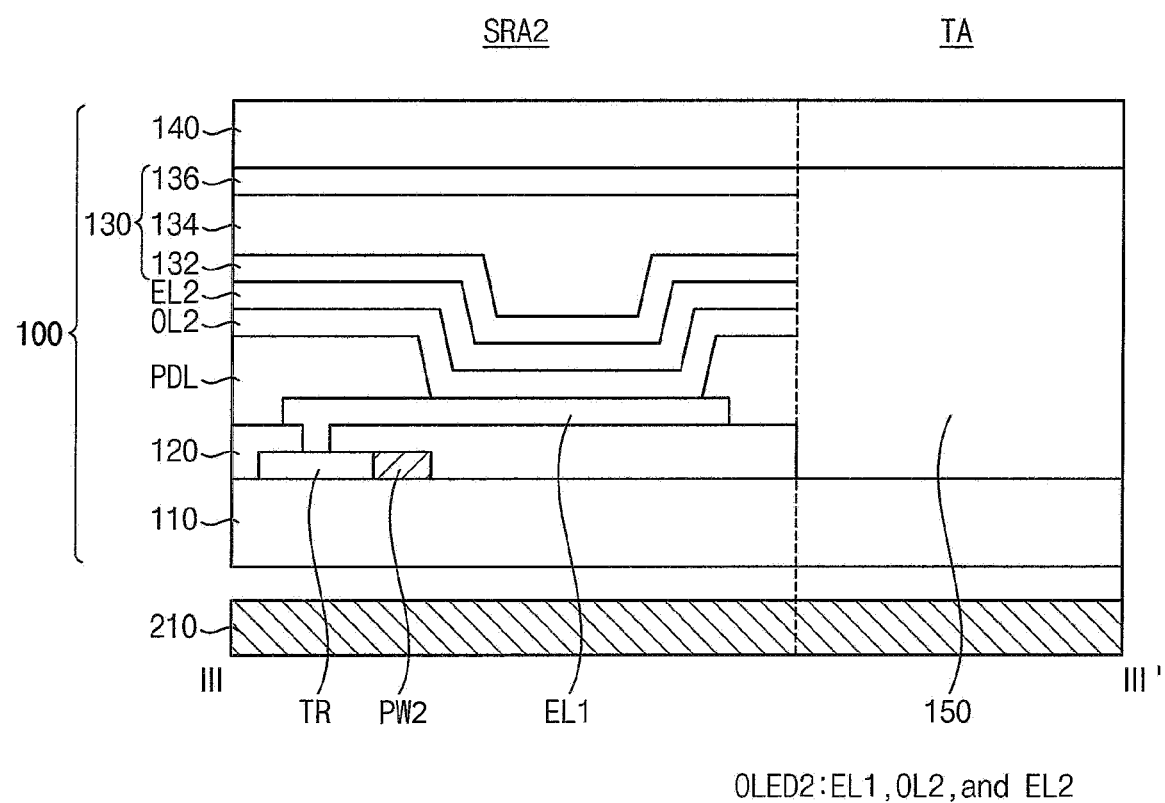
FIG. 7 is a cross-sectional view taken along the line III-III' of FIG. 4.

FIG. 6 is a cross-sectional view taken along the line II-IF of FIG. 3. FIG. 7 is a cross-sectional view taken along the line of FIG. 4. For example, FIG. 6 may illustrate a cross-section of the first red subpixel area SRA1, and FIG. 7 may illustrate a cross-section of the second red subpixel area SRA2 and the light-transmitting area TA adjacent thereto.

Referring to FIG. 6, the display panel 100 may include a driving element TR disposed on a base substrate 110 in the first display area DA1. The driving element TR may be electrically connected to a corresponding light-emitting element. The light-emitting element may be an organic light-emitting diode. For example, the organic light-emitting diode may include a first electrode EL1, a second electrode EL2 and a first organic light-emitting layer OL1 disposed between the first electrode EL1 and the second electrode EL2.

For example, the base substrate 110 may include glass, quartz, sapphire, a polymeric material or the like.

In an exemplary embodiment, the driving element TR may include a thin film transistor. The driving element TR may include a plurality of thin film transistors.

For example, a channel layer of the thin film transistor may include amorphous silicon, multi-crystalline silicon (polysilicon) or a metal oxide. For example, the metal oxide may include two-component compound (ABx), ternary compound (ABxCy) or four-component compound (ABxCyDz), which contains indium (In), zinc (Zn), gallium (Ga), tin (Sn), titanium (Ti), aluminum (Al), hafnium (Hf), zirconium (Zr), magnesium (Mg). For example, the metal oxide may include zinc oxide (ZnOx), gallium oxide (GaOx), titanium oxide (TiOx), tin oxide (SnOx), indium oxide (InOx), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide (ZnZrxOy), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like.

The driving element TR may be covered by an insulation structure 120. The insulation structure 120 may include a combination of an inorganic insulation layer and an organic insulation layer.

The first electrode EL1 may function as an anode. For example, the first electrode EL1 may be formed as a light-transmitting electrode or a light-reflecting electrode according to the emission type of the display device (a front emission type or a rear emission type). When the first electrode EL1 is a reflecting electrode, the first electrode EL1 may include gold (Au), silver (Ag), aluminum (Al), copper (Cu), nickel (Ni), platinum (Pt), magnesium (Mg), chromium (Cr), tungsten (W), molybdenum (Mo), titanium (Ti) or a combination thereof, and may have a stacked structure further including a metal oxide layer including indium tin oxide, indium zinc oxide, zinc tin oxide, indium oxide, zinc oxide, tin oxide or a combination thereof.

The pixel-defining layer PDL is disposed on the insulation structure 120, and has an opening overlapping at least a portion of the first electrode EL1. For example, the pixel-defining layer PDL may include an organic insulating material. At least a portion of the first organic light-emitting layer OL1 may be disposed in the opening of the pixel-defining layer PDL. In an exemplary embodiment, the first organic light-emitting layer OL1 may extend continuously over a plurality of the pixel areas in the display area. In another exemplary embodiment, a first organic light-emitting layer OL1 may be formed as an isolated pattern corresponding to each of the subpixel areas.

The first organic light-emitting layer OL1 may have a single-layered structure or a multi-layered structure, which includes at least an emission layer and further includes at least one of a hole-injection layer (HIL), a hole-transporting layer (HTL), an electron-transporting layer (ETL) and an electron-injection layer (EIL). For example, the first organic light-emitting layer OL1 may include an emission layer patterned to correspond to each of the subpixel areas and a common layer including at least one of the hole-injection layer, a hole-transporting layer, an electron-transporting layer and the electron-injection layer.

In an exemplary embodiment, the first organic light-emitting layer OL1 may generate lights corresponding to the subpixel areas. For example, the first organic light-emitting layer OL1 disposed in the first red subpixel area SRA1 may generate a red light.

The second electrode EL2 may be formed as a light-transmitting electrode or a light-reflecting electrode according to the emission type of the display device. For example, the second electrode EL2 may include a metal, a metal alloy, a metal nitride, a metal fluoride, a conductive metal oxide or a combination thereof. For example, the second electrode EL2 may be formed as a common layer extending continuously over a plurality of pixel areas in the display areas.

The display panel 100 may further include an encapsulation layer 130 covering organic light-emitting diodes. The encapsulation layer 130 may extend to substantially cover an entire portion of the display areas.

For example, the encapsulation layer 130 may have a stacked structure of an inorganic thin film and an organic thin film. For example, as illustrated in FIG. 5, the encapsulation layer 130 may include a first inorganic thin film 132, an organic thin film 134 disposed on the first inorganic thin film 132, and a second inorganic thin film 136 disposed on the organic thin film 134. However, exemplary embodiments are not limited thereto. For example, the encapsulation layer 130 may have a structure including at least two organic thin films and at least three inorganic thin films.

For example, the organic thin film 134 includes a cured resin such as polyacrylate or the like. For example, the cured resin may be formed by cross-linking reaction of monomers. For example, the inorganic thin films 132 and 136 may include an inorganic material such as silicon oxide, silicon nitride, silicon carbide, aluminum oxide, tantalum oxide, hafnium oxide, zirconium oxide, titanium oxide or the like.

In an exemplary embodiment, a window cover 140 may be disposed on the encapsulation layer 130 to protect the display panel 100. For example, the window cover 140 may include glass, polymeric material or a combination thereof.

For example, at least one of a polarizing layer and a touch-sensing structure may be further disposed between the window cover 140 and the encapsulation layer 130.

Referring to FIG. 7, the display panel 100 may include a driving element TR disposed on a base substrate 110 in the second display area DA2. The driving element TR may be electrically connected to a corresponding light-emitting element. The light-emitting element may be an organic light-emitting diode. For example, the organic light-emitting diode may include a first electrode EL1, a second electrode EL2 and a second organic light-emitting layer OL2 disposed between the first electrode EL1 and the second electrode EL2. The organic light-emitting diode disposed in the first display area DA1 may be referred to as a first organic light-emitting diode OLED1, and the organic light-emitting diode disposed in the second display area DA2 may be referred to as a second organic light-emitting diode OLED2. The display panel 100 may include a transmitting part 150 in the light-transmitting area TA of the second display area DA2. For example, the transmitting part 150 may be defined by an area between the window cover 140 and the base substrate 110. The transmitting part 150 may have a configuration different from the subpixel area adjacent thereto to increase light transmittance.

In an exemplary embodiment, the transmitting part 150 may exclude at least the electrodes EL1 and EL2 of the organic light-emitting diode and conductive layers forming the driving element TR. Thus, the transmitting part 150 may include an insulation structure, an organic light-emitting layer and an encapsulation layer. In another exemplary embodiment, the transmitting part 150 may consist of an organic light-emitting layer and an encapsulation layer.

A first functional module 210 may be disposed under the second display area DA2. The first functional module 210 may performed a desired function by using external light entering the first functional module 210 through the light-transmitting area TA.

The third display area DA3 may have substantially the same configuration as the second display area DA2 except for the size of the light-transmitting area. Thus, any duplicated explanation may be omitted to avoid redundancy.

Figure 8:
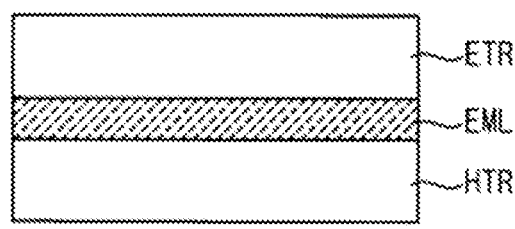
FIG. 8 is an enlarged cross-sectional view of an organic light-emitting layer in the first display area of the display device of FIG. 1.
Figure 9:
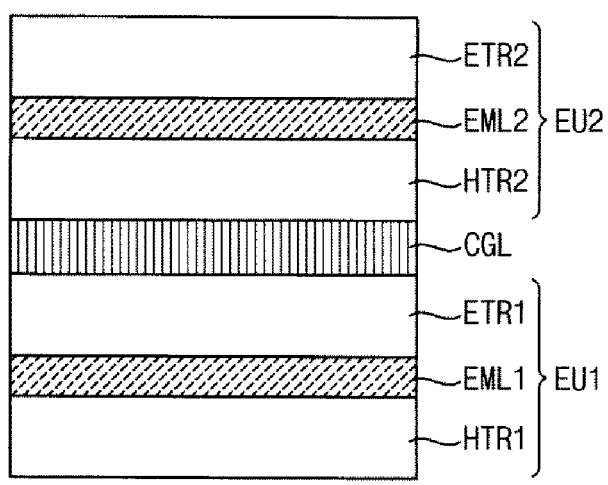
FIGS. 9 and 10 are enlarged cross-sectional views of organic light-emitting layers in the second display area of the display device of FIG. 1.
Figure 10:
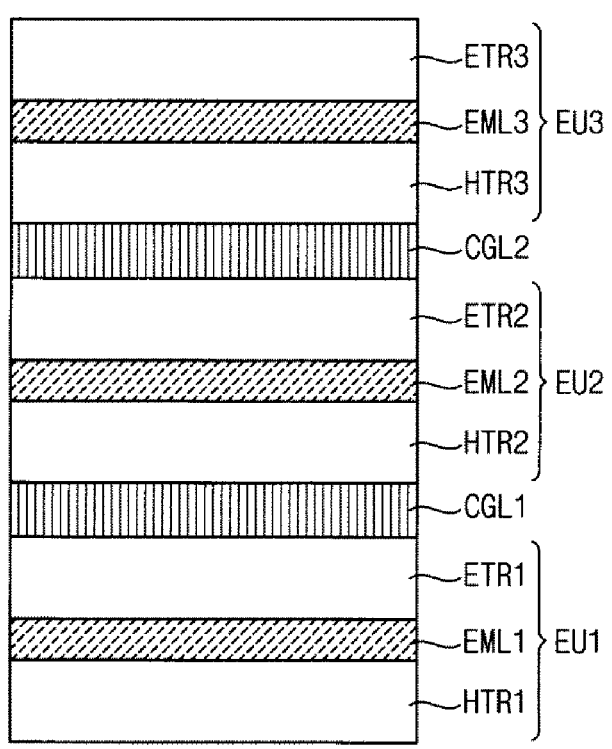

FIG. 8 is an enlarged cross-sectional view of an organic light-emitting layer in the first display area of the display device of FIG. 1. FIGS. 9 and 10 are enlarged cross-sectional views of organic light-emitting layers in the second display area of the display device of FIG. 1.

In an exemplary embodiment, the first organic light-emitting layer OL1 disposed in the first display area DA1 may have a different configuration from the second organic light-emitting layer OL2 disposed in the second display area DA2 or in the third display area DA3 and adjacent to the light-transmitting area TA.

For example, the first organic light-emitting layer OL1 may have a single light-emission structure, and the second organic light-emitting layer OL2 may have a tandem light-emission structure.

Referring to FIG. 8, the first organic light-emitting layer OL1 may include an emission layer EML, an electron-transporting region ETR and a hole-transporting region HTR. The emission layer EML may be disposed between the electron-transporting region ETR and the hole-transporting region HTR. For example, the electron-transporting region ETR may include an electron-transporting layer, and the hole-transporting region HTR may include a hole-transporting layer and a hole-injection layer. In an exemplary embodiment, the electron-transporting region ETR may be electrically connected to the second electrode EL2 of the first organic light-emitting diode OLED1, and the hole-transporting region HTR may be electrically connected to the first electrode EL1 of the first organic light-emitting diode OLED1.

The emission layer EML may include a host, which is a light-emitting material. For example, the emission layer EML may include Alq3(tris(8-hydroxyquinolino)aluminum), CBP(4,4'-bis(N-carbazolyl)-1,1'-biphenyl), PVK (poly(n-vinylcabazole), ADN(9,10-di(naphthalene-2-yl)anthracene), TCTA(4,4',4"-Tris(carbazol-9-yl)-triphenylamine), TPBi(1,3,5-tris(N-phenylbenzimidazole-2-yl)benzene), TBADN(3-tert-butyl-9,10-di(naphth-2-yl)anthracene), DSA(distyrylarylene), CDBP(4,4'-bis(9-carbazolyl)-2,2'-dimethyl-biphenyl), MADN(2-Methyl-9,10-bis(naphthalen-2-yl)anthracene), DPEPO(bis[2-(diphenylphosphino)phenyl]ether oxide), CP1(Hexaphenyl cyclotriphosphazene), UGH2(1,4-Bis(triphenylsilyl)benzene), DPSiO3 (Hexaphenylcyclotrisiloxane), DP SiO4(Octaphenylcyclotetra siloxane), PPF(2,8-Bis(diphenylphosphoryl)dibenzofuran) or a combination thereof.

The emission layer EML may further include a dopant, which may be varied depending on a color of a light to be generated.

For example, when the emission layer EML is configured to generate a red light, the emission layer EML may further include PtOEP(Pt(II) octaethylporphine), Ir(piq)3(tris(2-phenylisoquinoline)iridium), Btp2Ir(acac)(bis(2-(2'-benzothienyl)-pyridinato-N,C3')iridium(acetylacetonate) or a combination thereof as a red dopant.

For example, when the emission layer EML is configured to generate a green light, the emission layer EML may further include Ir(ppy)3(tris(2-phenylpyridine)iridium), Ir(ppy)2(acac)(Bis(2-phenylpyridine)(Acetylacetonato) iridium(III)), Ir(mppy)3(tris(2-(4-tolyl)phenylpiridine) iridium), C545T(10-(2-benzothiazolyl)-1,1,7,7-tetramethyl-2,3,6,7-tetrahydro-1H,5H,11H-[1]benzopyrano [6,7,8-ij]-quinolizin-11-one) or a combination thereof as a green dopant.

For example, when the emission layer EML is configured to generate a blue light, the emission layer EML may further include (4,6-F2ppy)2Irpic or the like as a blue dopant.

The hole-transporting region HTR may have various configurations which are known in the art. For example, the hole-transporting region HTR may include at least one of a hole-injection layer and a hole-transporting layer, and may further include a hole buffer layer, an electron-blocking layer or the like.

In an exemplary embodiment, the hole-transporting region HTR may include a hole-injection layer and a hole-transporting layer sequentially stacked on the first electrode EL1.

For example, the hole-injection layer may include a phthalocyanine compound such as copper phthalocyanine, DNTPD (N,N'-diphenyl-N,N'-bis-[4-(phenyl-m-tolyl-amino)-phenyl]-biphenyl-4,4'-diamine), m-MTDATA(4,4', 4"'-tris(3-methylphenylamino)triphenylamine), TDATA(4,4'4"-Tris(N,N-diphenylamino)triphenylamine), 2TNATA(4,4',4"-tris{N,-(2-naphthyl)-N-phenylamino}-triphenylamine), HATCN(1,4,5,8,9,11-hexaazatriphenylene hexacarbonitrile), PEDOT/PSS(Poly(3,4-ethylenedioxythiophene)/Poly(4-styrenesulfonate)), PANT/DB SA(Polyaniline/Dodecylbenzene sulfonic acid), PANI/CSA(Polyaniline/Camphor sulfonic acid), PANI/PSS(Polyaniline/Poly(4-styrenesulfonate) or a combination thereof.

For example, the hole-transporting layer may include a carbazole derivative such as N-phenycarbazole, polyvinylcarbazole or the like, a fluorene derivative, a triphenylamine derivative such as TPD(N,N-bis(3-methylphenyl)-N,N'-diphenyl[1,1-biphenyl]-4,4'-diamine), TCTA(4,4',4"'-tris (Ncarbazolyl)triphenylamine) or the like, NPB(N,N'-di(1-naphthyl)-N,N-diphenylbenzidine), TAPC(4,4'-Cyclohexylidene bis[N,N-bis(4-methylphenyl) benzenamine]) or a combination thereof.

The hole buffer layer may be disposed between the hole-injection layer and the hole-transporting layer or between the hole-transporting layer and the emission layer EML.

The hole-transporting region HTR may further include a charge-generating material to increase a conductivity. The charge-generating material may be dispersed uniformly or irregularly in the hole-transporting region HTR. For example, the charge-generating material may be a p-dopant. For example, the p-dopant may include a quinone derivative such as TCNQ(Tetracyanoquinodimethane), F4-TCNQ(2,3,5,6-tetrafluoro-tetracyanoquinodimethane) or the like, a metal oxide such as tungsten oxide, molybdenum oxide or the like, or a combination thereof.

The electron-transporting region ETR may have various configurations which are known in the art. For example, the electron-transporting region ETR may include at least one of an electron-injection layer and an electron-transporting layer, and may further include an electron buffer layer, a hole-blocking layer or the like.

In an exemplary embodiment, the electron-transporting region ETR may include an electron-transporting layer and an electron-injection layer sequentially stacked on the emission layer EML.

For example, the electron-transporting layer may include Alq3(Tris(8-hydroxyquinolinato)aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), Bebq2(berylliumbis(benzoquinolin-10-olate)), ADN(9,10-di(naphthalene-2-yl)anthracene) or a combination thereof.

For example, the electron-injection layer may include LiF, LiQ (Lithium quinolate), $Li_2O$, BaO, NaCl, CsF, a lanthanoid metal such as Yb, a halogenated metal such as RbCl, RbI or the like, or a combination thereof.

Referring to FIG. 9, the second organic light-emitting layer OL2 may include a plurality of light emitters that may be in the form of light-emitting structure units. For example, the second organic light-emitting layer OL2 may include a first light-emitting structure unit EU1 adjacent to the first electrode EL1 and a second light-emitting structure unit EU2 adjacent to and disposed over the second electrode EL2.

The plurality of light-emitting structure units may respectively include an emission layer configured to generate a light in response to a current applied thereto. For example, the first light-emitting structure unit EU1 may include a first emission layer EML1, a first electron-transporting region ETR1 and a first hole-transporting region HTR1. The first emission layer EML1 may be disposed between the first electron-transporting region ETR1 and the first hole-transporting region HTR1. The second light-emitting structure unit EU2 may include a second emission layer EML2, a second electron-transporting region ETR2 and a second hole-transporting region HTR2. The second emission layer EML2 may be disposed between the second electron-transporting region ETR2 and the second hole-transporting region HTR2.

The first hole-transporting region HTR1 and the second hole-transporting region HTR2 may include at least one of a hole-injection layer and a hole-transporting layer, respectively, and may further include a hole buffer layer, an electron-blocking layer or the like. The first hole-transporting region HTR1 and the second hole-transporting region HTR2 may have the substantially same configuration or different configurations from each other.

The first electron-transporting region ETR1 and the second electron-transporting region ETR2 may include at least one of an electron-injection layer and an electron-transporting layer, respectively, and may further include an electron buffer layer, a hole-blocking layer or the like. The first electron-transporting region ETR1 and the second electron-transporting region ETR2 may have the substantially same configuration or different configurations from each other.

A connection layer CGL may be disposed between the first light-emitting structure unit EU1 and the second light-emitting structure unit EU2.

For example, the connection layer CGL may have a stacked structure including a p-dopant layer and an n-dopant layer. For example, the p-dopant layer may include a p-dopant such as HAT-CN, TCNQ, NDP-9 or a combination thereof, and the n-dopant layer may include an alkaline metal, an alkaline earth metal, a lanthanoid metal or a combination thereof.

The first organic light-emitting layer OL1 and the second organic light-emitting layer OL2 may be formed by vacuum evaporation, inkjet printing or the like. For example, the organic light-emitting layers may be formed by vacuum evaporation using a fine metal mask or the like. Furthermore, additional depositions may be performed to form a tandem structure in the second display area DA2 and in the third display area DA3.

In an exemplary embodiment, the first emission layer EML1 and the second emission layer EML2 may generate the same color light.

In an exemplary embodiment, the first organic light-emitting diode OLED1 including the first organic light-emitting layer OL1 may be disposed in the first red subpixel area SRA1 and may generate a red light. The second organic light-emitting diode OLED2 including the second organic light-emitting layer OL2 may be disposed in the second red subpixel area SRA2 and may generate a red light.

In an exemplary embodiment, the second organic light-emitting layer OL2 may include at least three light-emitting structure units.

For example, the second organic light-emitting layer OL2 may include a first light-emitting structure unit EU1, a second light-emitting structure unit EU2 and a third light-emitting structure unit EU3 as illustrated in FIG. 10.

The at least three light-emitting structure units may respectively include a emission layer configured to generate a light in response to a current applied thereto. For example, the first light-emitting structure unit EU1 may include a first emission layer EML1, a first electron-transporting region ETR1 and a first hole-transporting region HTR1. The first emission layer EML1 may be disposed between the first electron-transporting region ETR1 and the first hole-transporting region HTR1. The second light-emitting structure unit EU2 may include a second emission layer EML2, a second electron-transporting region ETR2 and a second hole-transporting region HTR2. The second emission layer EML2 may be disposed between the second electron-transporting region ETR2 and the second hole-transporting region HTR2. The third light-emitting structure unit EU3 may include a third emission layer EML3, a third electron-transporting region ETR3 and a third hole-transporting region HTR3. The third emission layer EML3 may be disposed between the third electron-transporting region ETR3 and the third hole-transporting region HTR3.

The first hole-transporting region HTR1, the second hole-transporting region HTR2 and the third hole-transporting region HTR3 may include at least one of a hole-injection layer and a hole-transporting layer, respectively, and may further include a hole buffer layer, an electron-blocking layer or the like. The first hole-transporting region HTR1, the second hole-transporting region HTR2 and the third hole-transporting region HTR3 may have substantially the same configuration or different configurations from each other.

The first electron-transporting region ETR1, the second electron-transporting region ETR2 and the third electron-transporting region ETR3 may include at least one of an electron-injection layer and an electron-transporting layer, respectively, and may further include an electron buffer layer, a hole-blocking layer or the like. The first electron-transporting region ETR1, the second electron-transporting region ETR2 and the third electron-transporting region ETR3 may have the substantially same configuration or different configurations from each other.

A first connection layer CGL1 may be disposed between the first light-emitting structure unit EU1 and the second light-emitting structure unit EU2. A second connection layer CGL2 may be disposed between the second light-emitting structure unit EU2 and the third light-emitting structure unit EU3.

For example, as the second display area DA2 has the light-transmitting area TA, the display device may have a lowered brightness in the second display area DA2. In order to compensate for a decrease in brightness in the second display area DA2, a method of increasing a driving current in the second display area DA2 having the lowered brightness may be considered. However, when a driving current is selectively increased in a partial area (e.g., an area having a lowered brightness) of a display device including organic light-emitting diodes having the same light-emitting structure in an entire display area, the durability or life-span of the organic light-emitting diodes in the partial area where the driving current is increased may be reduced. Thus, the durability or life-span and reliability of the display device may be reduced.

In an exemplary embodiment, in order to compensate for the decrease of brightness in the second display area DA2, the second display area DA2 may include the second organic light-emitting layer OL2. For example, since the second organic light-emitting layer OL2 includes a plurality of light-emitting structure units, the second organic light-emitting layer OL2 may generate light having a brightness greater than the first organic light-emitting layer OL1 with a single light-emitting structure unit. Furthermore, even when a driving current applied to the second organic light-emitting layer OL2 may be increased to increase the brightness in a specific area having a lowered brightness, deterioration in the specific area may be prevented by a tandem structure.

A power wiring for providing a power voltage to the second display area DA2 may be separated from a power wiring providing a power voltage to the first display area DA1 in order to increase the brightness of the second organic light-emitting layer OL2 and to minimize a decrease in power efficiency.

For example, as shown in FIGS. 6-7, the display device may include a first power wiring PW1, which transfers a substantially constant voltage to the first display area DA1, and a second power wiring PW2, which transfers a substantially constant voltage to the second display area DA2. Different voltages may be applied to the first power wiring PW1 and the second power wiring PW2 through the separate power wirings (e.g., the first and second power wirings PW1 and PW2). A first driving element disposed in the first display area DA1 may be electrically connected to the first power wiring PW1 to provide a first driving voltage to the first organic light-emitting diode OLED1. A second driving element disposed in the second display area DA2 may be electrically connected to the second power wiring PW2 to provide a second driving voltage to the second organic light-emitting diode OLED2.

In an exemplary embodiment, a configuration of the third display area DA3 may be substantially the same as or similar to the configuration of the second display area DA2.

In an exemplary embodiment, the first organic light-emitting diode OLED 1 disposed in the first display area DA1 may have a single light-emitting structure unit. However, exemplary embodiments are not limited thereto.

For example, the first organic light-emitting diode OLED1 disposed in the first display area DA1 and the second organic light-emitting diode OLED2 disposed in the second display area DA2 may have tandem structures different from each other.

For example, the first organic light-emitting diode OLED1 disposed in the first display area DA1 may include two vertically stacked, light-emitting structure units as illustrated in FIG. 9, and the second organic light-emitting diode OLED2 disposed in the second display area DA2 may include three vertically stacked light-emitting structure units as illustrated in FIG. 10.

In another exemplary embodiment, the first organic light-emitting diode OLED1 disposed in the first display area DA1 may include a single light-emitting structure unit, the second organic light-emitting diode OLED2 disposed in the second display area DA2 may include two light-emitting structure units, and the third organic light-emitting diode disposed in the third display area DA3 may include three light-emitting structure units.

In an exemplary embodiment, entire organic light-emitting diodes disposed in the second display area DA2 may have a tandem structure. However, exemplary embodiments are not limited thereto. For example, the organic light-emitting diodes disposed in the second display area DA2 may partially have a tandem structure. In an exemplary embodiment, an organic light-emitting diode disposed in a second blue subpixel area SBA2 may include a plurality of light-emitting structure units, and organic light-emitting diodes disposed in a second red subpixel area SRA2 and in a second green subpixel area SGA2 may include a single light-emitting structure unit. For example, the number of the light-emitting structure units in the second red subpixel area SRA2 and the second green subpixel area SGA2 may be less than the number of the light-emitting structure units in the second blue subpixel area SBA2. For example, the second blue subpixel area SBA2 may include a first sub-diode of the second organic light-emitting diode OLED2, and the second red subpixel area SRA2 or the second green subpixel area SGA2 may include a second sub-diode of the second organic light-emitting sub-diode OLED2. The number of the light-emitting structure units of the second sub-diode in the second red subpixel area SRA2 or the second green subpixel area SGA2 may be less than the number of the light-emitting structure units of the first sub-diode in the second blue subpixel area SBA2

The configuration of the exemplary embodiment described above may selectively increase the brightness of the blue subpixel area having a relatively low light-emitting efficiency. Thus, the brightness decrease in the second display area DA2 may be effectively compensated by minimizing a decrease in power efficiency.

In an exemplary embodiment, the first organic light-emitting layer OL1 disposed in the first display area DA1 and the second organic light-emitting layer OL2 disposed in the second display area DA2 may include different materials from each other. For example, the second organic light-emitting layer OL2 may include a light-emitting material having a light-emitting efficiency greater than a light-emitting material included in the first organic light-emitting layer OL1.

In an exemplary embodiment, the first organic light-emitting layer OL1 may include a fluorescence dopant, and the second organic light-emitting layer OL2 may include a phosphorescence dopant. In an exemplary embodiment, the first organic light-emitting layer OL1 may include a phosphorescence dopant, and the second organic light-emitting layer OL2 may include a thermally activated delayed fluorescence (TADF) dopant. In an exemplary embodiment, the first organic light-emitting layer OL1 may include a fluorescence dopant, and the second organic light-emitting layer OL2 may include a TADF dopant.

For example, the fluorescence dopant may include perylene, TBPe(2,5,8,11-tetra-tert-butylperylene), BCzVB (1,4-bis[2-(3-N-ethylcarbazoryl)vinyl]benzene), BCzVBi(4, 4'-bis(9-ethyl-3-carbazovinylene)-1,1'-biphenyl), BDAVBi (4,4'-bis[4-diphenylamino]styryl)biphenyl), DPAVB(4-(di-p-tolylamino)-4'-[(di-ptolylamino)styryl]stilbene), DPAVBi (4,4'-bis[4-(di-p-tolylamino)styryl]bipnehyl), DSA-Ph(1-4-di-[4-(N,N-diphenyl)amino]styryl-benzene), Coumarin 6, C545T, DMQA(N,N'-dimethyl-quinacridone), DBQA(5,12-Dibutylquinacridone), TTPA(9,10-bis[N,N-di-(p-tolyl)-amino]anthracene), TPA(9,10-bis[phenyl(m-tolyl)-amino] anthracene), BA-TTB, BATAB, BA-NPB, DEQ(N,N'-diethylquinacridone), DCM(4-(dicyanomethylene)-2-methyl-6[p-(dimethylamino)styryl]-4H-pyran), DCM2(4-(dicyanomethylene)-2-methyl-6-julolidyl-9-enyl-4H-pyran), DCJT(4-(dicyanomethylene)-2-methyl-6-(1,1,7,7-tetramethyljulolidyl-9-enyl)-4H-pyran), DCJTB (4-(Dicyanomethylene)-2-tert-butyl-6-(1,1,7,7,-tetramethyljulolidyl-9-enyl)-4Hpyran), DCJTI, DCJMTB, DPP(6,13-diphenylpentacene), DCDDC(3-(dicyanomethylene)-5,5-dimethyl-1-[(4-dimethylamino)styryl]cyclohexene), AAAP(6-methyl-3-[3-(1,1,6,6-tetramethyl-10-oxo-2, 3,5,6-tetrahydro-1H,4H,10H-11-oxa-3a-azabenzo[de]-anthracen-9-yl)acryloyl]pyran-2,4-dione), (PPA)(PSA)Pe-1 (3-(N-phenyl-N-p-tolylamino)-9-(N-p-styrylphenyl-N-p-tolylamino)perylene), BSN(1,10-dicyano-substituted bisstyrylnaphthalene derivative), DBP(tetraphenyldibenzoperiflanthene), TBRb(2,8-di-tert-butyl-5,11-bis(4-tert-butylphenyl)-6,12-diphenyltetracene), rubrene or a combination thereof.

For example, the phosphorescence dopant may include a transition metal complex. For example, the transition metal complex may include a complex of Iridium (Ir), Platinum (Pt), Osmium (Os), gold (Au), Titanium (Ti), Zirconium (Zr), Hafnium (Hf), Europium (Eu), Terbium (Tb), Thulium (Tm) or a combination thereof. For example, examples of the phosphorescence dopant may include the red dopant, the green dopant and the blue dopant, which are previously described.

For example, the TADF dopant may include a heterocyclic compound. For example, the heterocyclic compound may include a core including an oxidized thiadiazole.

A combination of the dopants having different light-emitting efficiencies may be varied depending on a wavelength of a light generated by organic light-emitting layers.

In an exemplary embodiment, the organic light-emitting layer disposed in the first green subpixel area SGA1 of the first display area DA1 may include a fluorescence dopant, and the organic light-emitting layer disposed in the second green subpixel area SGA2 of the second display area DA2 may include a phosphorescence dopant. The organic light-emitting layer disposed in the first red subpixel area SRA1 of the first display area DA1 may include a phosphorescence dopant, and the organic light-emitting layer disposed in the second red subpixel area SRA2 of the second display area DA2 may include a TADF dopant. The organic light-emitting layer disposed in the first blue subpixel area SBA1 of the first display area DA1 may include a fluorescence dopant, and the organic light-emitting layer disposed in the second blue subpixel area SBA2 of the second display area DA2 may include a phosphorescence dopant.

The ratio of the dopants may be adjusted to control variance of color coordinates.

In an exemplary embodiment, the configuration of the third display area DA3 may be substantially the same as or similar to the configuration of the second display area DA2.

Figure 11:
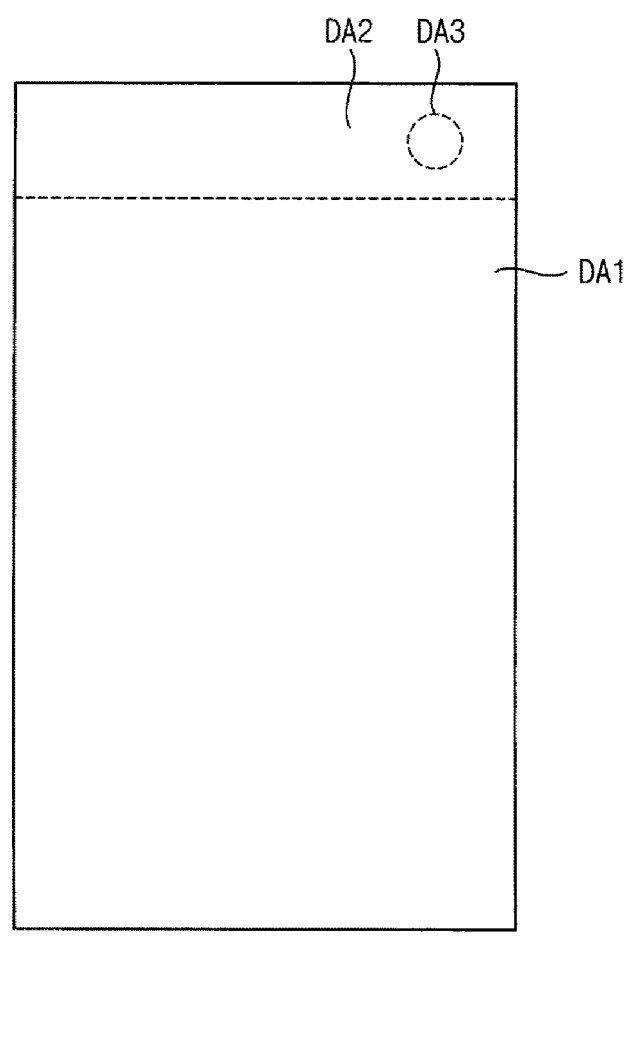
FIGS. 11 to 13 are plan views of other exemplary embodiments of display devices constructed according to the principles of the invention.
Figure 12:
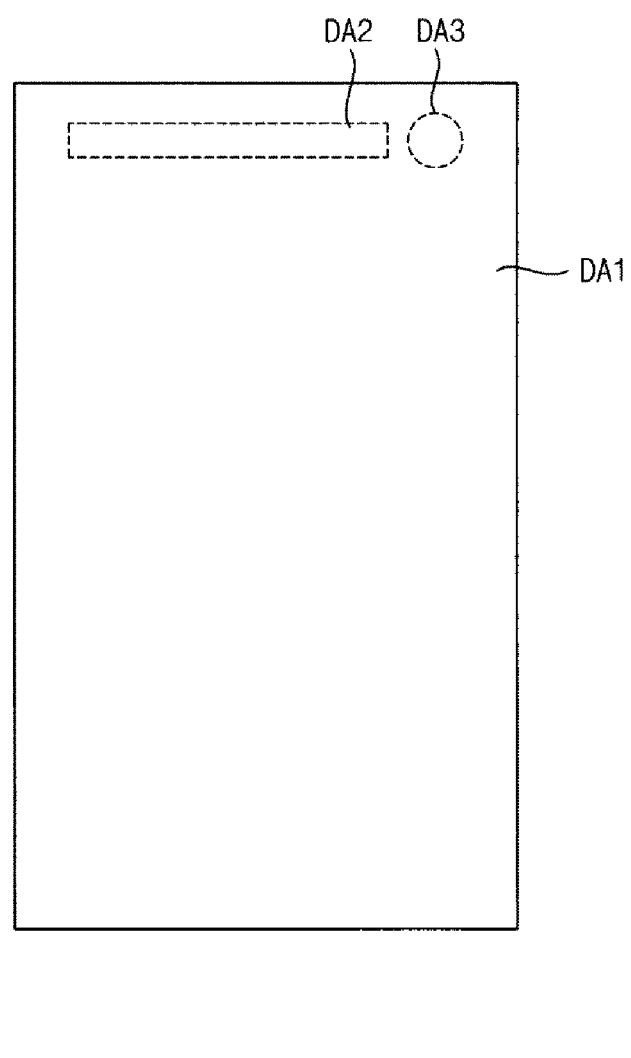
Figure 13:
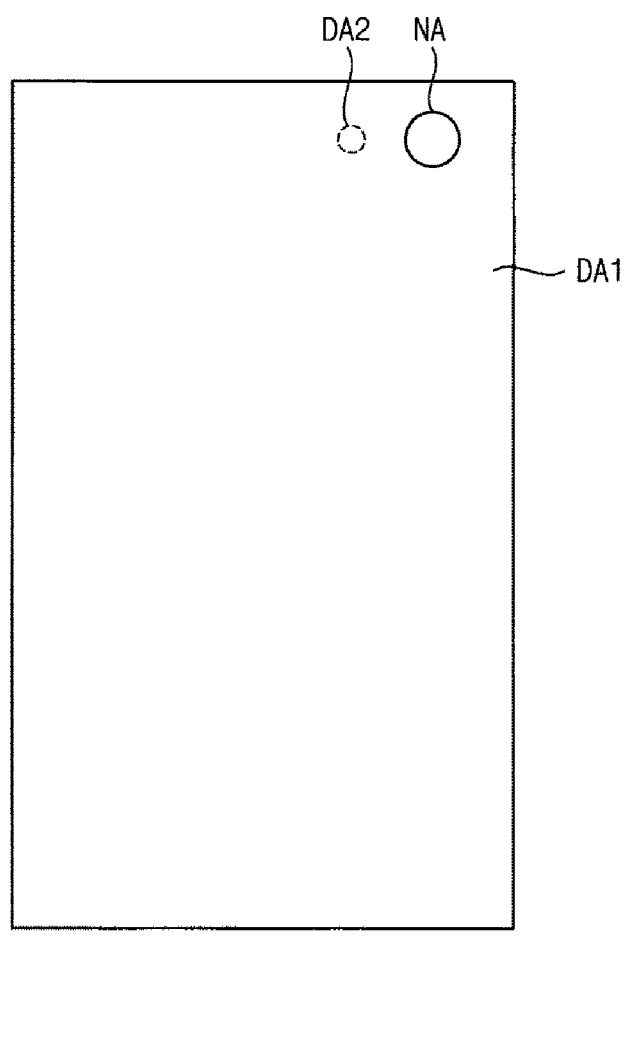

In exemplary embodiments, a display area may have various shapes and arrangements. FIGS. 11 to 13 are plan views of other exemplary embodiments of display devices constructed according to the principles of the invention.

Referring to FIG. 11, a display panel of a display device 20 may include a first display area DA1, a second display area DA2 and a third display area DA3. The light transmittance of the second display area DA2 in a unit area is greater than the light transmittance of the first display area DA1 in a unit area. The light transmittance of the third display area DA3 in a unit area is greater than the light transmittance of the second display area DA2 in a unit area. The second display area DA2 may be adjacent to the first display area DA1 in a first direction D1 and may extend in a second direction D2 intersecting the first direction D1. Furthermore, the second display area DA2 may surround the third display area DA3 having a hole shape.

Referring to FIG. 12, a display panel of a display device 30 may include a first display area DA1, a second display area DA2 and a third display area DA3. The light transmittance of the second display area DA2 in a unit area is greater than the light transmittance of the first display area DA1 in a unit area. The light transmittance of the third display area DA3 in a unit area is greater than the light transmittance of the second display area DA2 in a unit area. The second display area DA2 may be disposed within the first display area DA1 and may extend in a second direction D2 intersecting a first direction D1. Furthermore, the second display area DA2 may be spaced apart from the third display area DA3 having a hole shape.

Referring to FIG. 13, a display panel of a display device 40 may include a first display area DA1 and a second display area DA2. The light transmittance of the second display area DA2 in a unit area is greater than the light transmittance of the first display area DA1 in a unit area. The second display area DA2 may overlap a sensor module.

In an exemplary embodiment, the display panel may further include a non-display area NA. For example, the non-display area NA may be disposed within the display area or may be inwardly recessed from an edge of the display area. The non-display area NA does not generate a light. At least one of a light-emitting structure including a light-emitting element, a circuit structure including a conductive wiring, an insulation structure, an encapsulation layer and a base substrate may be removed in the non-display area NA to increase a light transmittance thereof. In an exemplary embodiment, the light-emitting structure, the circuit structure, the conductive wiring, the insulation structure, the encapsulation layer and the base substrate may be entirely removed in the non-display area NA to form a hole.

The display device 40 may further include a camera module overlapping the non-display area NA. The camera module may be disposed under of the non-display area NA of the display panel. In another exemplary embodiment, a portion of the camera module may be inserted into a hole corresponding to the non-display area NA.

In an exemplary embodiment, the display device includes the non-display area NA so that a light amount entering the camera module may be increased.

Exemplary embodiments may include various display devices including a light-transmitting area. For example, a second display area having an increased light transmittance may not overlap a functional module in a display device according to an exemplary embodiment. The display device may implement a transparent display having a partially light-transmitting area.

Exemplary embodiments may be applied to various display devices. For example, exemplary embodiments may be applied to vehicle-display device, a ship-display device, an aircraft-display device, portable communication devices, display devices for display or for information transfer, a medical-display device, etc.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. An organic light-emitting display device comprising:
a display panel having a first display area, a second display area, and a third display area, the first and second display areas having unit areas with different light transmittances, the light transmittance of the unit area of the second display area being greater than the light transmittance of the unit area of the first display area, and the third display area having a unit area with greater light transmittance than those of the first display area and the second display area;
a sensor module overlapping the second display area;
a camera module overlapping the third display area; and
a plurality of organic light-emitting diodes disposed in the first display area and the second display area,
wherein:
a first organic light-emitting diode disposed in the first display area and a second organic light-emitting diode disposed in the second display area each include at least one light emitter, and the number of the light emitter included in the second organic light-emitting diode is greater than the number of the light emitter included in the first organic light-emitting diode;
the second display area includes a pixel area and a light-transmitting area, which are alternately arranged; and the second organic light-emitting diode is disposed in the pixel area of the second display area; and
the second organic light-emitting diode is disposed in the pixel area of the second display area.

2. The organic light-emitting display device of claim 1, wherein the at least one light emitter comprises a light-emitting structure unit having at least an emission layer and at least one of a hole-transporting layer, a hole-injection layer, an electron-transporting layer and an electron-injection layer.

3. The organic light-emitting display device of claim 1, wherein the first organic light-emitting diode has a single light-emitting structure, and the second organic light-emitting diode has a multiple light-emitting structure.

4. The organic light-emitting display device of claim 1, wherein the first organic light-emitting diode includes two light-emitting structure units, and the second organic light-emitting diode includes at least three light-emitting structure units.

5. The organic light-emitting display device of claim 1, wherein the second display area comprises a first color subpixel area and a second color subpixel area, and wherein:
the first color subpixel area comprises a first sub-diode of the second organic light-emitting diode,
the second color subpixel area comprises a second sub-diode of the second organic light-emitting diode, and
the number of a light emitter of the second sub-diode in the second color subpixel area is smaller than the number of a light emitter of the first sub-diode in the first color subpixel area.

6. The organic light-emitting display device of claim 1, wherein the display panel includes:
a first driving element configured to supply a first driving voltage to the first organic light-emitting diode;
a second driving element configured to supply a second driving voltage to the second organic light-emitting diode; and
power wirings configured to transfer a power voltage to the first and second driving elements, wherein:
a first power wiring electrically connected to the first driving element is configured to receive a first constant voltage, and
a second power wiring electrically connected to the second driving element is configured to receive a second constant voltage different from the first constant voltage.

7. The organic light-emitting display device of claim 1, wherein the second organic light-emitting diode is configured to generate a light having a greater brightness than the first organic light-emitting diode.

8. An organic light-emitting display device comprising:
a display panel including a substrate and having a first display area and a second display area, the first and second display areas having unit areas with different light transmittances and being spaced apart from each other in a direction along a surface of the substrate; and,
a plurality of organic light-emitting diodes disposed in the first display area and the second display area on the surface of the substrate;
wherein a first organic light-emitting diode disposed in the first display area has a first emission layer and a second organic light-emitting diode disposed in the second display area has a second emission layer configured to emit a light with a same color as the first emission layer, and the first and second emission layers comprising chemically different materials such that the second emission layer includes a dopant that is not included in the first emission layer,
wherein the first emission layer includes either a fluorescence dopant or a phosphorescence dopant,
wherein, when the first emission layer includes the fluorescence dopant from among the fluorescence dopant or the phosphorescence dopant, the second emission layer includes a phosphorescence dopant, and
wherein, when the first emission layer includes the phosphorescence dopant from among the fluorescence dopant or the phosphorescence dopant, the second emission layer includes a thermally activated delayed fluorescence dopant.

9. The organic light-emitting display device of claim 8, wherein the second display area comprises a pixel area and a light-transmitting area, which are alternately arranged, wherein the second organic light-emitting diode is disposed in the pixel area of the second display area.

10. The organic light-emitting display device of claim 8, further comprising a functional module overlapping the second display area, the functional module including at least one of a camera module and a sensor module.

11. The organic light-emitting display device of claim 8, wherein the display panel further comprises a third display area having a unit area with greater light transmittance than those of the first display area and the second display area.

12. An organic light-emitting display device comprising:
 a display panel including a first display area, a second display area, and a third display area, the first and second display areas having unit areas with different light transmittances, and the third display area having a unit area with greater light transmittance than those of the first display area and the second display area;
 a sensor module overlapping the second display area and a camera module overlapping the third display area; and
 a plurality of organic light-emitting diodes disposed in the first display area and the second display area,
 wherein a first organic light-emitting diode disposed in the first display area has a first emission layer and a second organic light-emitting diode disposed in the second display area has a second emission layer configured to emit a light with a same color as the first emission layer, and the first and second emission layers comprising chemically different materials.

* * * * *